(12) United States Patent
Bagley et al.

(10) Patent No.: US 7,201,055 B1
(45) Date of Patent: Apr. 10, 2007

(54) ULTRASONIC MINIATURE AIR GAP INSPECTION CRAWLER

(75) Inventors: Paul C. Bagley, Middleburgh, NY (US); Richard Hatley, Convention Station, NJ (US); Robert M. Roney, Schoharie, NY (US); Kenneth Hatley, Madison, NJ (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/163,196

(22) Filed: Oct. 10, 2005

(51) Int. Cl.
*G01N 29/04* (2006.01)

(52) U.S. Cl. .............. 73/618; 73/619; 73/620; 73/623; 73/633; 73/634; 376/249; 376/252

(58) Field of Classification Search ............ 73/618, 73/619, 620, 623, 633, 634; 376/249, 252
See application file for complete search history.

(56) References Cited

U.S. PATENT DOCUMENTS

| | | | |
|---|---|---|---|
| 3,930,942 A * | 1/1976 | Thome | 376/463 |
| 4,569,230 A * | 2/1986 | Asty et al. | 73/623 |
| 4,581,938 A * | 4/1986 | Wentzell | 73/623 |
| 4,803,563 A | 2/1989 | Dailey et al. | |
| 4,876,672 A * | 10/1989 | Petermann et al. | 367/35 |
| 5,105,658 A | 4/1992 | Jaafar et al. | |
| 5,156,803 A * | 10/1992 | Engding et al. | 376/249 |
| 5,285,689 A * | 2/1994 | Hapstack et al. | 73/623 |
| 5,365,166 A | 11/1994 | Dailey et al. | |
| 5,635,780 A | 6/1997 | Kohlert et al. | |
| 5,650,579 A * | 7/1997 | Hatley et al. | 73/865.8 |
| 6,100,711 A * | 8/2000 | Hatley | 324/772 |
| 6,404,189 B2 * | 6/2002 | Kwun et al. | 324/220 |
| 6,672,413 B2 * | 1/2004 | Moore et al. | 180/9.21 |
| 6,889,783 B1 * | 5/2005 | Moore et al. | 180/9.21 |
| 7,077,020 B2 * | 7/2006 | Langley et al. | 73/865.8 |
| 2004/0148730 A1 * | 8/2004 | Knight et al. | 15/339 |
| 2005/0217394 A1 * | 10/2005 | Langley et al. | 73/865.8 |

FOREIGN PATENT DOCUMENTS

| | | | |
|---|---|---|---|
| EP | 0794437 A2 * | 9/1997 | |
| JP | 2002-209363 | * | 7/2002 |

* cited by examiner

*Primary Examiner*—Hezron Williams
*Assistant Examiner*—Samir M. Shah
(74) *Attorney, Agent, or Firm*—Sutherland Asbill & Brennan LLP

(57) ABSTRACT

A miniature air gap inspection crawler. The miniature air gap inspection crawler may include a base, a linear drive mechanism and a circumferential drive mechanism such that either the linear drive mechanism or the circumferential drive mechanism may be employed, and an inspection module connected to the base.

20 Claims, 3 Drawing Sheets

ULTRASONIC MINIATURE AIR GAP INSPECTION CRAWLER

TECHNICAL FIELD

The present invention relates generally to a miniature robotic device and more particularly relates to a miniature robotic device for performing in-situ ultrasonic inspections of a generator field.

BACKGROUND OF THE INVENTION

The visual inspection of a generator field and stator should be performed on a periodic basis. Conventional generator/stator inspection and testing procedures typically require the complete disassembly of the stator and the removal of the generator field from the stator before any inspections or tests can be performed on the unit. The cost of the disassembly and the removal of the field, the time it takes for this process, and the dangers of field removal have led to the occasional omission of the generator and stator examinations from outage schedules.

In-situ inspections of generators have been performed employing poles, trolleys, and field turning techniques. These procedures have not accomplished the inspection task in a satisfactory manner.

Miniature air gap inspection crawlers are disclosed in commonly owned U.S. Pat. Nos. 5,650,579 and 6,100,711, the contents of which are hereby incorporated by reference. These crawlers are designed to pass through the radial air gap between the core iron and the retaining ring for in-situ inspection of the field and stator core.

Video cameras and other inspection tools attached to the crawler may be used to perform generator field and stator core inspections. For example, a high-resolution video camera provides the operator with a clear view of the stator core laminations, stator wedges, field wedges, and the in-board ends of the retaining rings. The device thus provides detection capability for loose stator wedges, vibration bar sparking, core lamination damage due to foreign objects, motoring and hot spots, field wedge arcing, and surface heating damage. Through the generator in-situ inspection, information is gathered on the condition of the generator that can help determine if field removal is necessary.

Although these known devices are adequate for visual inspection, these visual systems cannot detect internal defects such as cracks or pits in the field teeth. Rather, such cracks can only be found by ultrasonic inspection. Currently, however, the rotor must be pulled out of the stator before an ultrasonic inspection can be performed.

There is a desire therefore for a device and method to perform in-situ ultrasonic inspection of a generator stator and field. The device preferably should be sized to pass through the radial air gap.

SUMMARY OF THE INVENTION

The present application thus describes a miniature air gap inspection crawler. The miniature air gap inspection crawler may include a base, a linear drive mechanism and a circumferential drive mechanism such that either the linear drive mechanism or the circumferential drive mechanism may be employed, and an inspection module connected to the base.

The base may include a number of magnets positioned therein. The base also may include a retractable keeper plate positioned adjacent to the magnets.

The linear drive mechanism may include a pair of belt assemblies. The circumferential drive mechanism may include a pair of wing assemblies. The wing assemblies may be maneuvered about the base such that either the linear drive mechanism or the circumferential drive mechanism may be employed. The circumferential drive mechanism may include a pair of drive roller assemblies.

The inspection module may include an ultrasonic device. The inspection module also may include a camera.

The crawler also may include a traverse assembly mounted to the base such that the inspection module is positioned within the traverse assembly. The traverse assembly may include a screw assembly for movement in a first direction. The traverse assembly also may include a number of swing arms for movement in a second direction.

The present application also describes a method of inspecting a generator field with a crawler having a linear drive mechanism and a circumferential drive mechanism. The method may include attaching magnetically the crawler to the field, engaging the circumferential drive mechanism, traveling in a circumferential direction, disengaging the circumferential drive mechanism, and traveling in a linear direction. The method of further may include conducting an ultrasonic inspection of the field and/or conducting a visual inspection of the field.

The present application further may describe a miniature air gap inspection crawler. The miniature air gap inspection crawler may include a base, a number of magnets positioned within the base, a linear drive mechanism and a circumferential drive mechanism such that either the linear drive mechanism or the circumferential drive mechanism may be employed, and an ultrasonic inspection module connected to the base.

The linear drive mechanism may include a pair of belt assemblies. The circumferential drive mechanism may include a pair of wing assemblies. The wing assemblies may be maneuvered about the base such that either the linear drive mechanism or the circumferential drive mechanism may be employed. The circumferential drive mechanism may include a pair of drive roller assemblies.

These and other features of the present invention will become apparent to one of ordinary skill in the art upon review of the following detailed description when taken in conjunction with the drawings and the appended claims.

DETAILED DESCRIPTION

Figure 1:
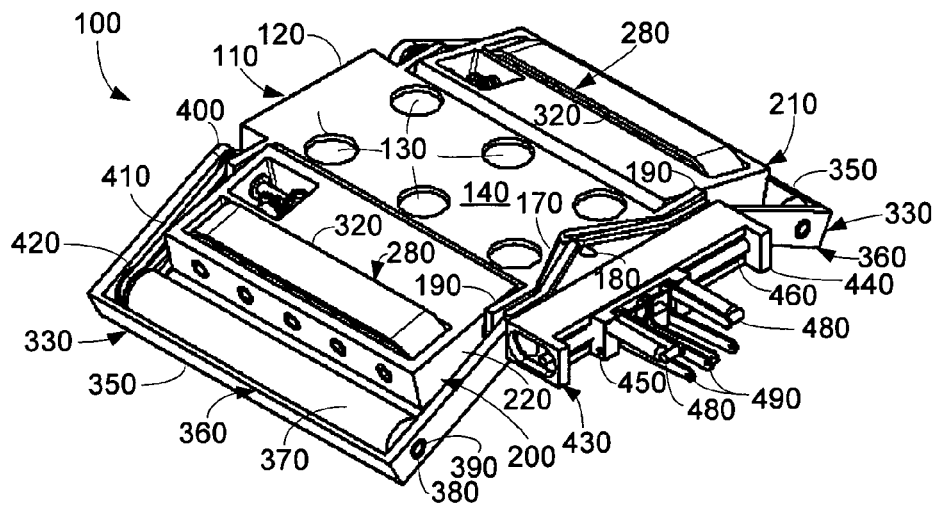
FIG. 1 a perspective view of a miniature air gap inspection crawler as is described herein.
Figure 2:
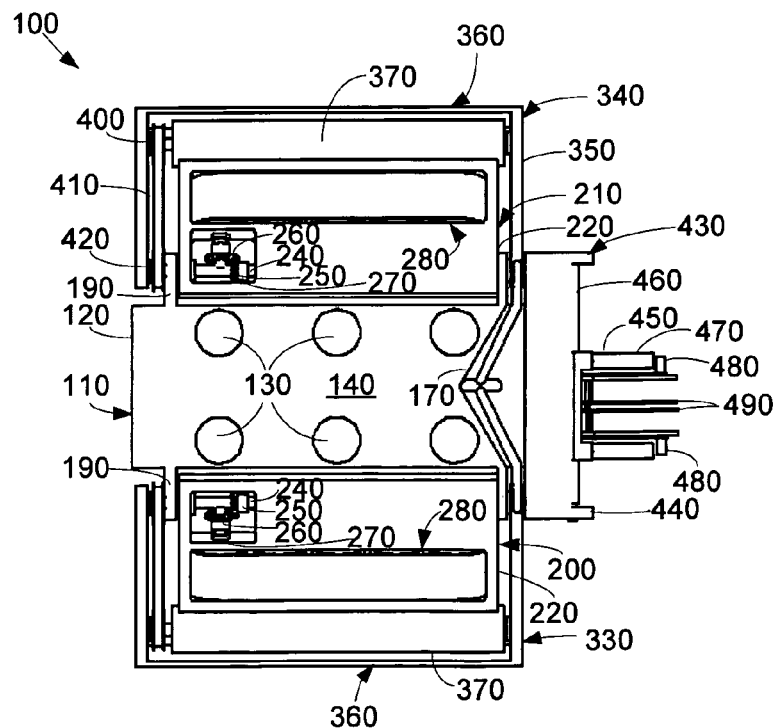
FIG. 2 is a bottom plan view of the crawler of FIG. 1.
Figure 3:
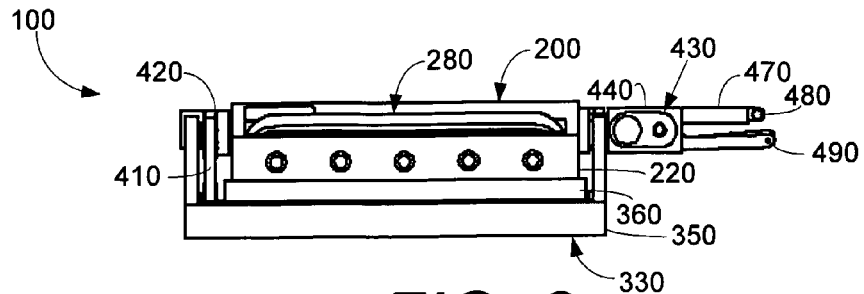
FIG. 3 is a side plan view of the crawler of FIG. 1.
Figure 4:
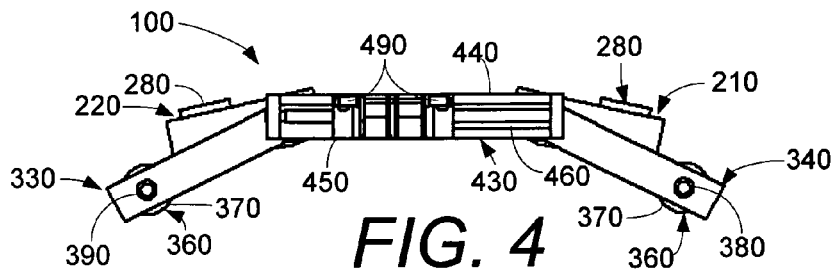
FIG. 4 is a front plan view of the crawler of FIG. 1.
Figure 5:
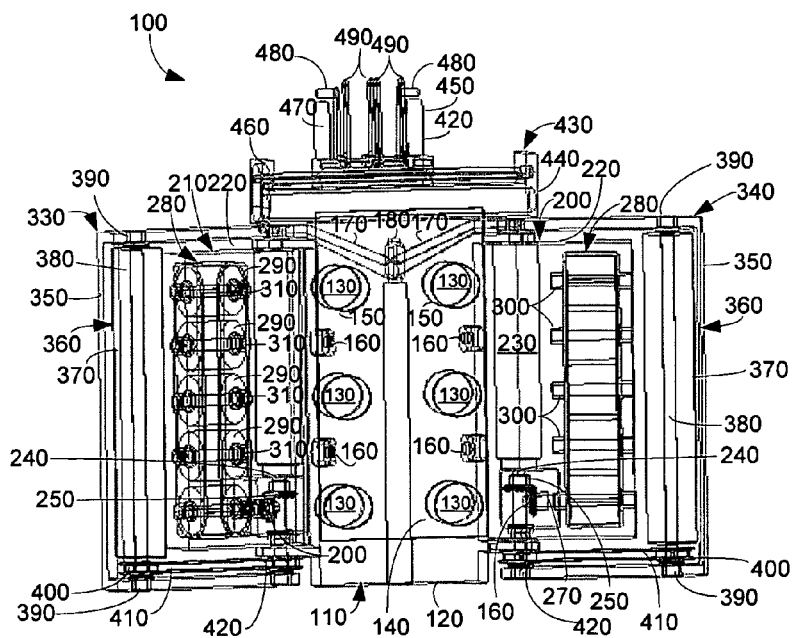
FIG. 5 is a transparent view of the crawler of FIG. 1.

Referring now to the drawings, in which like numerals indicate like elements throughout the several views, FIGS. 1–6 show a miniature air gap inspection crawler 100 as is described herein. As described above, the crawler 100 may be dimensioned so as to fit within a typical radial air gap. The crawler 100 generally includes a number of individual modules or components as will be described in more detail below.

The crawler 100 may include a center module 110. The center module 110 may include a center body 120. The center body 120 may be largely rectangular in shape and substantially hollow so as to serve as a housing for the components described below. The center body 120 may be made out of aluminum, non-magnetic stainless steel, or similar types of materials.

Positioned within the center body 120 may be a number of magnets 130. The magnets 130 may be electromagnets or rare earth permanent magnets. Other types of magnetic devices or attachment devices also may be used herein. In this example, six (6) permanent magnets 130 are used herein although any number of magnets 130 may be employed. As will be described in more detail below, the magnets 130 keep the crawler 100 in contact with the field.

The magnets 130 may be positioned behind a keeper plate 140. The keeper plate 140 may be made out of carbon steel, magnetic stainless steel, or similar types of materials. The keeper plate 140 may have a number of apertures 150 positioned therein. The apertures 150 align with the magnets 130 when the crawler 100 is in use, i.e., when magnetic attraction is desired. When it is desired to deactivate the magnets 130, the keeper plate 140 moves along the center body 120 such that the apertures 150 are no longer aligned with the magnets 130. The keeper plate 140 thus blocks the magnets 130 and the magnetic attraction. The keeper plate 140 may move along the center body 120 via a number of wheels 160 positioned therein. The keeper plate 140 may be maneuvered by an air ram, solenoid, a motor, a spring, or similar types of devices for reciprocating movement along the center body 120.

The center module 110 also may have a pair of linking arms 170. The linking arms 170 may be made out of aluminum, stainless steel, composite materials, or similar materials. The linking arms 170 may pivot about a post 180. The linking arms 170 cooperate with the wing assemblies as will be described in more detail below.

The center module 110 also may have a number of flanges 190 attached thereto. The flanges 190 may be positioned at the respective corners of the center module 110 for mounting the further components described below. Other types of mounting means may be used herein.

The flanges 190 may be used to connect a pair of motor pod assemblies, a first motor pod assembly 200 and a second motor pod assembly 210, to the center module 110. Because the motor pod assemblies 200, 210 are identical, only the first motor pod assembly 200 will be described herein.

The motor pod assembly 200 includes a motor pod housing 220. The motor pod housing 220 may be largely hollow so as to house the components described below. The motor pod housing 220 may be made out of aluminum, stainless steel, composite materials, or similar types of materials.

A motor 230 may be positioned within the motor pod housing 220. The motor 230 may be a servomotor, a stepper motor, a pneumatic device, a hydraulic device, or similar types of drive devices. The motor 230 may drive a drive shaft 240 extending therefrom. The shaft 240 may drive a wing assembly as will be described in more detail below. A gearwheel 250 may be positioned on the shaft 240. The gearwheel 250 may be a beveled gearwheel or a similar design. The gearwheel 250 may be in communication with a second gearwheel 260. The second gearwheel 260 may be largely identical to the first gearwheel 250.

The second gearwheel 260 may be connected to a second drive shaft 270. The second drive shaft 270 may drive a belt assembly 280. The belt assembly 280 may have a number of drive wheels 290. In this example, five (5) drive wheels 290 are used, although any number of drive wheels 290 may be used. The drive wheels 290 may be connected to the motor pod housing 280 via a number of rotating shafts 300. Each of the shafts 300 may be positioned within a bushing 310. The drive wheels 290 may drive a drive belt 320. The drive belt 320 may be made out of reinforced urethane, rubber, or similar types of materials. The second drive shaft 270 drives one of the drive wheels 290 so as to power the drive belts 320. Other types of drive mechanisms such as a pair of reciprocating feet, or similar types of devices may be used herein as is desired.

Also attached to center module 110 may be a pair of wing assemblies, a first wing assembly 330 and a second wing assembly 340. Because the wing assemblies 330, 340 are identical only the first wing assembly 330 will be described herein. As will be described in more detail below, the wing assemblies 330, 340 may be raised or lowered via the linking arms 170 of the center module 110.

The first wing assembly 330 includes a side frame 350. The side frame 350 may be attached to the flanges 190 of the center module 110. The side frame 350 may be made out of aluminum, stainless steel, composite materials, or similar types of materials. Mounted within the side frame 350 may be a drive roller assembly 360. The roller assembly 360 includes a roller 370. The roller 370 may be made out of urethane, rubber, or similar types of materials. The roller 370 is attached to the side frame 350 via a roller shaft 380 and a pair of bushing 390. One or more rollers 370 may be used herein.

Also attached to the roller shaft 380 may be a chain wheel 400. The chain wheel 400 may be connected via a drive belt 410 to a second chain wheel 420. The second chain wheel 420 may be attached to the drive shaft 240 of the motor pod assemblies 200, 210. As described above, the motor 230 may drive the drive shaft 240. Rotation of the drive shaft 240 thus rotates the roller 370 of the roller assembly 360 via the drive belt 410. Other types of drive mechanisms such as a pair of reciprocating feet or similar types of devices may be used herein as is desired.

Also attached to the center module 110 may be a traverse assembly 430. The traverse assembly 430 may be connected to the center module 110 via a mounting block 440. The mounting block 440 may have any desired size or shape. Positioned on the mounting block 440 may be a traverse block 450. The traverse block 450 may be maneuverable along the horizontal direction via a traverse screw thread 460. The screw thread 460 may be powered by a servo or a stepper motor or similar types of devices. The traverse block 450 may have a pair of mounting arms 470 positioned thereon. Also positioned on the traverse block 450 may be a pair of connecting links 480. The connecting links 480 may secure an inspection device to the traverse block 450 as will be described in more detail below. The traverse block 450 also may have a number of swing arms 490. In this example, four (4) swing arms 490 are used, although any number may be used. The swing arms 490 permit movement of the inspection device at an angle along the vertical plane. The swing arms 490 may be powered via a pneumatic cylinder, a motor, or similar types of devices.

Figure 6:
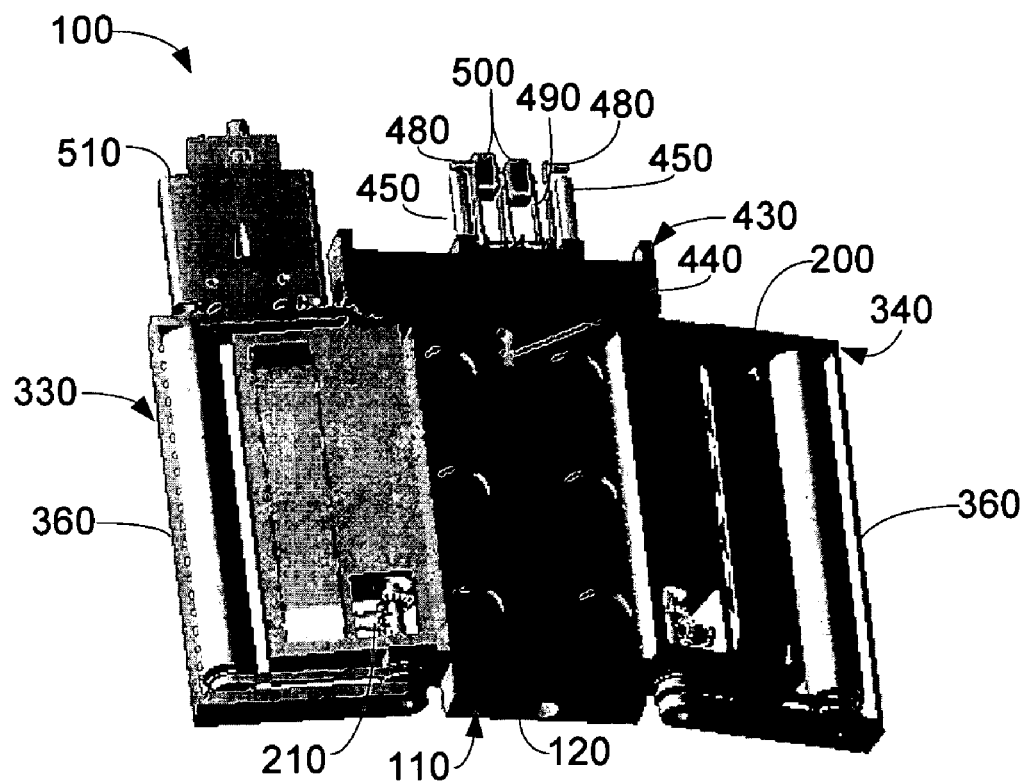
FIG. 6 is a perspective view of the crawler of FIG. 1 with transducer heads and a camera module attached thereto.

FIG. 6 shows the crawler 100 with a pair of ultrasonic transducers 500 positioned within the connecting links 480 and the swing arms 490 of the traverse assembly 430. The transducers 500 may be of conventional design. The transducers 500, or any type of inspection device, may be maneuvered in the horizontal direction via the screw thread 460. The transducers 500 also may be maneuvered in the vertical direction via the swing arms 490. The transducers 500 may detect cracks as small as 0.025 inches (about 0.635 millimeters. The crawler 100 also may have means for spreading couplant before the transducers 500 and/or a means to vacuum the couplant after use. The couplant can be any desired fluid, including water. Any other types of inspection means may be used herein.

As is shown in FIG. 6, the crawler 100 also may have a camera module 510 positioned thereon. The camera module 510 may be any conventional type of video device. A suitable camera 510 is manufactured by Elmo Inc., of Hyde Park, N.Y., and commonly referred to as a "lip stick" camera or a split head camera. A miniature CCD ("Charge-Coupled Device") or CMOS ("Complementary Metal Oxide Semiconductor") cameras also may be used. The camera module 510 may include a full view camera, a fixed focus used for navigation and detection, and a variable view camera with a power focus assembly in a right angle prism to allow for viewing of the stator and other surfaces. The camera module 510 may be of conventional design. Other types of monitoring or detection devices also may be mounted onto the crawler 100.

In use, the crawler 100 may be positioned within the radial air gap for introduction to the field. The crawler 100 attaches itself to the field via the magnets 130. The motors 230 drive the belt assemblies 280 of the motor pod assemblies 200, 210 and the roller assemblies 360 of the wing assemblies 330, 340 simultaneously. Depending upon whether or not the wing assemblies 330, 340 are raised or lowered, the crawler 100 either moves circumferentially via the roller assemblies 360 or front to back, i.e., linearly, via the belt assemblies 280. If the wing assemblies 330, 340 are lowered via the linking arms 170, the roller assemblies 360 move the crawler 100 in the circumferential direction. When the wing assemblies 330, 340 are raised and out of contact with the field, the crawler 100 moves front to back via the belt assemblies 280. As such, the crawler 100 can move in any desired direction along the field. When the crawler 100 needs to be removed, the magnets 130 may be blocked via the keeper plate 140 so as to block the magnetic attraction.

The crawler 100 thus has full access to all areas of the field. The crawler 100 can be maneuvered in any desired pattern so as to provide ultrasonic and other types of inspections. Alternatively, the crawler 100 may be maneuvered directly to an area of suspected damage.

It should be apparent that the foregoing relates only to the preferred embodiments of the present invention and that numerous changes and modifications may be made herein by one of ordinary skill in the art without departing from the general spirit and scope of the invention as defined by the following claims and the equivalents thereof.

What is claimed is:

1. A miniature air gap inspection crawler, comprising:
a base;
a linear drive mechanism connected to the base to drive the miniature air gap inspection crawler;
a circumferential drive mechanism connected to the base to drive the miniature air gap inspection crawler;
wherein either the linear drive mechanism or the circumferential drive mechanism may be employed; and
an inspection module connected to the base.

2. The crawler of claim 1, wherein the base comprises a plurality of magnets positioned therein.

3. The crawler of claim 2, wherein the base comprises a retractable keeper plate positioned adjacent to the plurality of magnets.

4. The crawler assembly of claim 1, wherein the linear drive mechanism comprises a pair of belt assemblies.

5. The crawler of claim 1, wherein the circumferential drive mechanism comprises a pair of wing assemblies.

6. The crawler of claim 5, wherein the pair of wing assemblies may be maneuvered about the base such that either the linear drive mechanism or the circumferential drive mechanism may be employed.

7. The crawler of claim 1, wherein the circumferential drive mechanism comprises a pair of drive roller assemblies.

8. The crawler of claim 1, wherein the inspection module comprises an ultrasonic device.

9. The crawler of claim 1, wherein the inspection module comprises a camera.

10. The crawler of claim 1, further comprising a traverse assembly mounted to the base and wherein the inspection module is positioned within the traverse assembly.

11. The crawler of claim 10, wherein the traverse assembly comprises a screw assembly for movement in a first direction.

12. The crawler of claim 10, wherein the traverse assembly comprises a plurality of swing arms for movement in a second direction.

13. A method of inspecting a generator field with a crawler having a linear drive mechanism and a circumferential drive mechanism, comprising;
attaching magnetically the crawler to the field;
engaging the circumferential drive mechanism to drive the crawler;
traveling in a circumferential direction;
inspecting the generator field;
disengaging the circumferential drive mechanism;
engaging the linear drive mechanism to drive the crawler; and
traveling in a linear direction.

14. The method of claim 13, wherein the step of inspecting the generator field comprises conducting an ultrasonic inspection of the field.

15. The method of claim 13, wherein the step of inspecting the generator field comprises conducting a visual inspection of the field.

16. A miniature air gap inspection crawler, comprising:
a base;
a plurality of magnets positioned within the base;
a linear drive mechanism connected to the base to drive the miniature air gap inspection crawler;
a circumferential drive mechanism connected to the base to drive the miniature air gap inspection crawler;
wherein either the linear drive mechanism or the circumferential drive mechanism may be employed; and
an ultrasonic inspection module connected to the base.

17. The crawler assembly of claim 16, wherein the linear drive mechanism comprises a pair of belt assemblies.

18. The crawler of claim 16, wherein the circumferential drive mechanism comprises a pair of wing assemblies.

19. The crawler of claim 18, wherein the pair of wing assemblies may be maneuvered about the base such that either the linear drive mechanism or the circumferential drive mechanism may be employed.

20. The crawler of claim 16, wherein the circumferential drive mechanism comprises a pair of drive roller assemblies.

* * * * *